United States Patent
Lagally et al.

(10) Patent No.: US 11,588,456 B2
(45) Date of Patent: Feb. 21, 2023

(54) ELECTROPLATED HELICAL SLOW-WAVE STRUCTURES FOR HIGH-FREQUENCY SIGNALS

(71) Applicants: WISCONSIN ALUMNI RESEARCH FOUNDATION, Madison, WI (US); THE REGENTS OF THE UNIVERSITY OF NEW MEXICO, Albuquerque, NM (US)

(72) Inventors: Max G. Lagally, Madison, WI (US); Matthew McLean Dwyer, Madison, WI (US); Daniel Warren van der Weide, Madison, WI (US); Abhishek Bhat, Fremont, CA (US); Francesca Cavallo, Albuquerque, NM (US); Divya Jyoti Prakash, Albuquerque, NM (US)

(73) Assignee: Wisconsin Alumni Research Foundation, Madison, WI (US)

( * ) Notice: Subject to any disclaimer, the term of this patent is extended or adjusted under 35 U.S.C. 154(b) by 478 days.

(21) Appl. No.: 16/882,591

(22) Filed: May 25, 2020

(65) Prior Publication Data
US 2021/0367573 A1   Nov. 25, 2021

(51) Int. Cl.
H03F 3/58   (2006.01)
H01J 23/16   (2006.01)
H01J 23/26   (2006.01)
H01J 25/36   (2006.01)

(52) U.S. Cl.
CPC .............. *H03F 3/58* (2013.01); *H01J 23/165* (2013.01); *H01J 23/26* (2013.01); *H01J 25/36* (2013.01)

(58) Field of Classification Search
CPC .......... H01J 23/165; H01J 23/26; H01J 25/36; H03F 3/58
See application file for complete search history.

(56) References Cited

U.S. PATENT DOCUMENTS

| | | |
|---|---|---|
| 3,916,246 A | 10/1975 | Preist |
| 4,571,524 A | 2/1986 | Mourier |
| 4,820,688 A | 4/1989 | Jasper |
| 5,112,438 A | 5/1992 | Bowers |
| 6,917,162 B2 | 7/2005 | Dayton |
| 7,707,714 B2 | 5/2010 | Schmidt et al. |
| 8,847,490 B2 | 9/2014 | Dayton et al. |
| 8,884,519 B2 | 11/2014 | Dayton et al. |
| 9,196,448 B2 | 11/2015 | Kasahara |

(Continued)

FOREIGN PATENT DOCUMENTS

| | | |
|---|---|---|
| EP | 1312102 | 8/2006 |
| JP | 2014-0292190 | 10/2014 |

OTHER PUBLICATIONS

Prinz et al., Terahertz metamaterials and systems based on rolled-up 3D elements: designs, technological approaches, and properties—Scientific reports, 2017—nature.com, pp. 1-15.

(Continued)

*Primary Examiner* — Joseph L Williams
(74) *Attorney, Agent, or Firm* — Bell & Manning, LLC

(57) ABSTRACT

Traveling-wave tube amplifiers and methods for making slow-wave structures for the amplifiers are provided. The SWSs include helical conductors that are self-assembled via the release of stressed electrically conductive strips from a sacrificial material. The helical conductors can be electroplated post-self-assembly to fortify the helix, reduce losses, and tailor the dimensions and operating parameters of the helix.

20 Claims, 14 Drawing Sheets

(56) References Cited

U.S. PATENT DOCUMENTS

| | | |
|---|---|---|
| 9,777,384 B2 | 10/2017 | Joye |
| 2003/0151366 A1 | 8/2003 | Dayton, Jr. |
| 2006/0057504 A1 | 3/2006 | Sadwick et al. |
| 2012/0176034 A1 | 7/2012 | Dayton et al. |
| 2016/0099127 A1 | 4/2016 | Aditya et al. |
| 2017/0207522 A1 | 7/2017 | Li et al. |
| 2019/0279834 A1 | 9/2019 | Van der weide et al. |
| 2021/0099142 A1 | 4/2021 | Lagally et al. |

OTHER PUBLICATIONS

Huang et al., "On-Chip Inductors with Self-Rolled-Up $SiN_x$ Nanomembrane Tubes: A Novel Design Platform for Extreme Miniaturization," Nano letters, 2012—ACS Publications, pp. 6283-6288.

Ren, Zheng, and Pu-Xian Gao. "A review of helical nanostructures: growth theories, synthesis strategies and properties." Nanoscale 6.16 (2014): 9366-9400.

Dayton, James A., et al. "Diamond-studded helical traveling wave tube." *IEEE Transactions on Electron Devices* 52.5 (2005): 695-701.

Lueck, M. R., et al. "Microfabrication of diamond-based slow-wave circuits for mm-wave and THz vacuum electronic sources," Journal of Micromechanics and Microengineering 21.6 (2011): 065022.

Tian et al., "Anisotropic rolling and Controlled Chirality of Nanocrystalline Diamond Nanomembranes toward Biomimetic Helical Frameworks," Nano Lett. 2018, 18, pp. 3688-3694.

Froeter et al., "3-D hierarchical architectures based on self-rolled-up silicon nitride membranes," Nanotechnology 24, 2013, 9 pages.

Filipovic et al., "Performance and Stress Analysis of Metal Oxide Films for CMOS-Integrated Gas Sensors," Sensors 2015, 15, 7206-7227.

R Koch, "The intrinsic stress of polycrystalline and epitaxial thin metal films," 1994 *j. Phys.Condens.. Matter*, 6 9519.

Bell et al., "Directed batch assembly of three-dimensional helical nanobelts through angular winding and electroplating," Nanotechnology 18 (2007 055304-055308.

Rao et al., "Estimation of circuit loss in a broadband segment-loaded helical slow-wave structure of a traveling-wave tube," *Int. J. Electron. Commun.* 64 (2010) 280-284.

International Search Report and Written Opinion for PCT/US2021/029854, dated Aug. 20, 2021.

ELECTROPLATED HELICAL SLOW-WAVE STRUCTURES FOR HIGH-FREQUENCY SIGNALS

REFERENCE TO GOVERNMENT RIGHTS

This invention was made with government support under FA9550-19-1-0086 awarded by the USAF/AFOSR. The government has certain rights in the invention.

BACKGROUND

A traveling-wave tube (TWT) is a vacuum electronic device enabling interaction between an energetic beam of electrons and an electromagnetic (EM) wave to transfer energy from the electron beam to the EM wave for amplification. TWTs are used as compact, high-gain, high-power sources of high-frequency radiation in applications such as wireless communications, biomedical imaging, radar, and electronic warfare. Central to the amplification process is a slow-wave structure (SWS) that matches the phase velocity of the EM wave to that of the electron beam; this structure is some form of meander transmission line or, more commonly, a conductive helix. The slow-wave structure conducts the traveling EM wave along a pathway whose total length is greater than the axial dimension along which the electron beam travels; thus, the component of the EM wave velocity along the axial dimension matches that of the electron beam.

Conventional TWT structures use a wire helix whose dimensions are limited by the smallest gauge wire available, the ability to wind the helix with precision, the ability to support the helix to keep it aligned with the electron beam, and the ability to handle and assemble the helix into the structure. Other methods for manufacturing helical SWSs rely on high-precision laser manufacturing and wafer bonding. Unfortunately, these methods are not easily scalable to micro-scale dimensions (and thus higher frequencies) and are not mass-producible on inexpensive and large-area substrates.

SUMMARY

Traveling-wave tube amplifiers and methods for making slow-wave structures for traveling-wave tube amplifiers are provided.

One embodiment of a traveling-wave tube amplifier includes: a dielectric support; a slow-wave structure on the dielectric support, the slow-wave structure comprising an electrically conductive helix comprising a continuous helical strip of electrically conductive material and having an inner diameter of no greater than 30 µm; an electron gun positioned to direct one or more beams of electrons axially through the electrically conductive helix or around the periphery of the electrically conductive helix; and an electron collector positioned opposite the electron beam source.

One embodiment of a method of making a slow-wave structure includes the steps of: forming a layer of sacrificial material on a portion of a surface of a dielectric support; forming a continuous stressed electrically conductive strip on the layer of sacrificial material, the electrically conductive strip having a leading end and a trailing end, wherein the trailing end of the electrically conductive strip is attached to the dielectric support; selectively removing the layer of sacrificial material, wherein the continuous stressed electrically conductive strip relaxes into the form of a helix; connecting the leading end of the electrically conductive strip to a first electrical contact; connecting the trailing end of the electrically conductive strip to a second electrical contact; and electroplating the surface of the helix with an electrically conductive material.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

DETAILED DESCRIPTION

TWT amplifiers and methods for making SWSs for TWT amplifiers are provided. The SWSs include helical conductors that are self-assembled via the release of stressed films from a sacrificial material. The self-assembly methods enable wafer-level fabrication of SWSs having very small diameters, including micron-scale diameters that enable the amplification of terahertz signals. The helical conductors can be electroplated post-self-assembly to fortify the helix, reduce losses, improve thermal conductance, and/or to tailor the dimensions and operating parameters of the helix.

Figure 1:
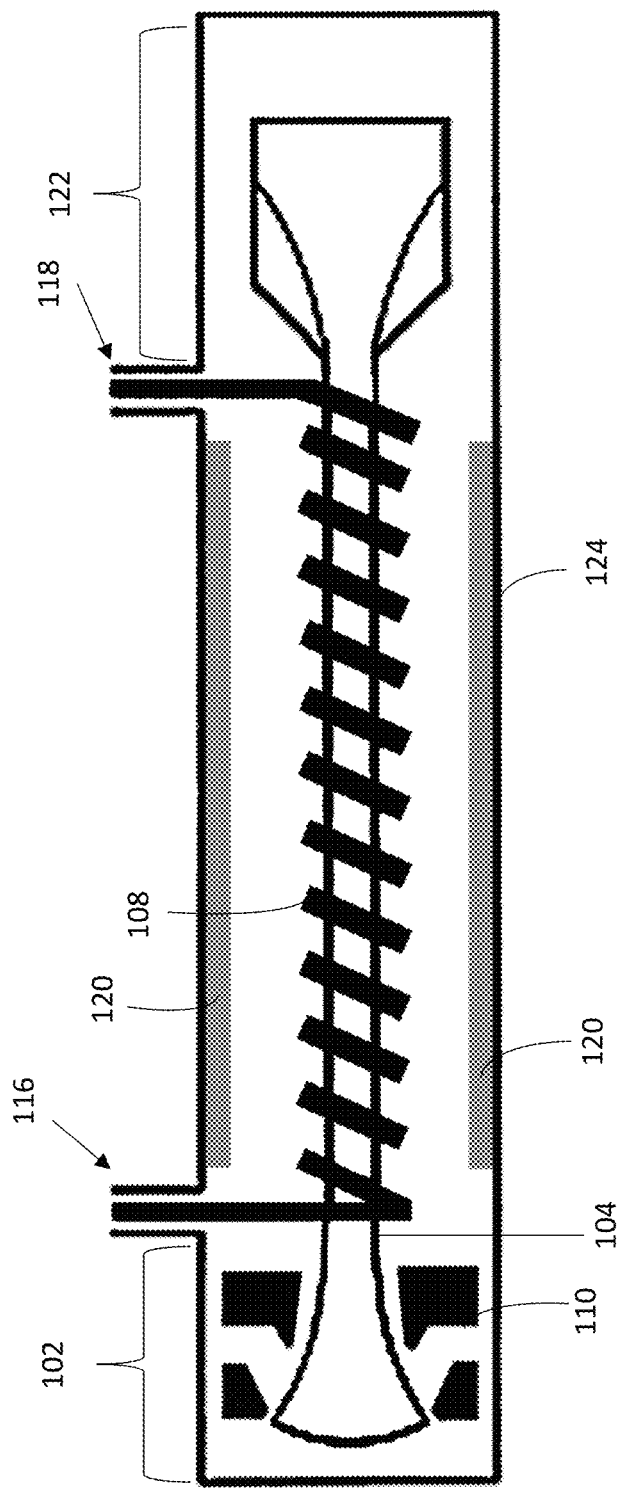
FIG. 1 is a schematic diagram of one embodiment of a TWT amplifier.

The basic components of one embodiment of a TWT amplifier are shown in FIG. 1. The components include an electron gun 102, positioned to direct an electron beam 104 along an axis 106 through an SWS comprising an electrically conductive helix 108 that spirals around axis 106. Electron gun 102 is composed of a control anode 110, a control grid 112, and a cathode 114. The TWT amplifier further includes a signal input coupler 116 that introduces an EM signal into helix 108 and a signal output coupler 118 that receives the amplified EM signal from helix 108. Steering magnets 120 or electric fields are arranged around helix 108 to focus and steer electron beam 104, and an electron collector 122 is positioned along axis 106, opposite electron gun 102, to remove the unused electron beam energy. Helix 108 is housed in a vacuum housing 124. An attenuator (not shown) may also be provided along the path of the electron beam to isolate the input and output.

When electron beam 104 is emitted from electron gun 102 and accelerated toward electron collector 122, the electrons are in close proximity to the propagating EM wave. The electron beam is directed along the axis of the helix either through the center of the helix or outside of the helix. In some embodiments, multiple electron beams ("beamlets") are used. These beamlets are directed in a circular pattern around the periphery of the helix. The conductive helix slows the axial phase velocity of the EM wave to, or below, the speed of the electrons in the beam. The kinetic energy in the electron beam is coupled into the EM wave, thereby amplifying the EM wave.

Figure 2A:
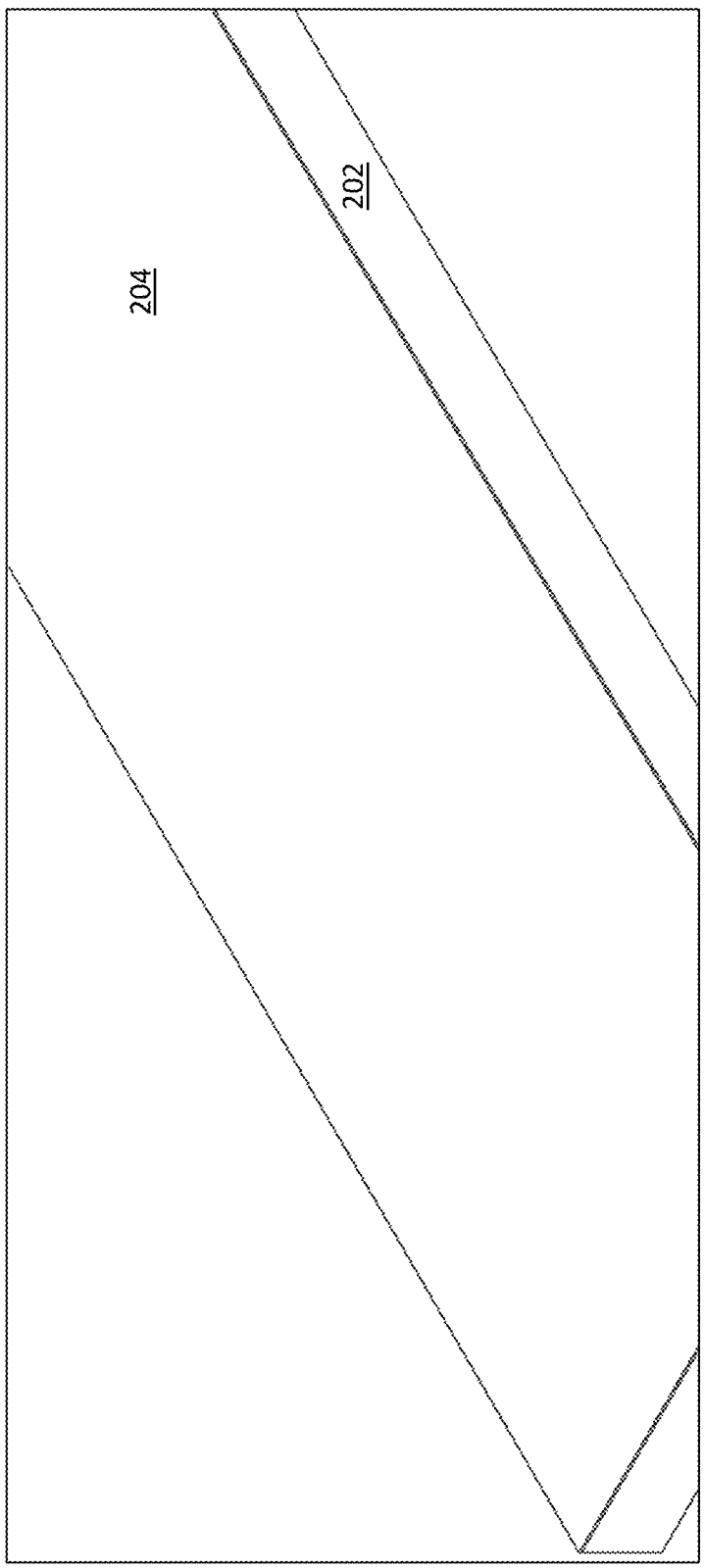
FIGS. 2A-2G illustrate a method of making one example of a slow-wave structure.
Figure 2B:
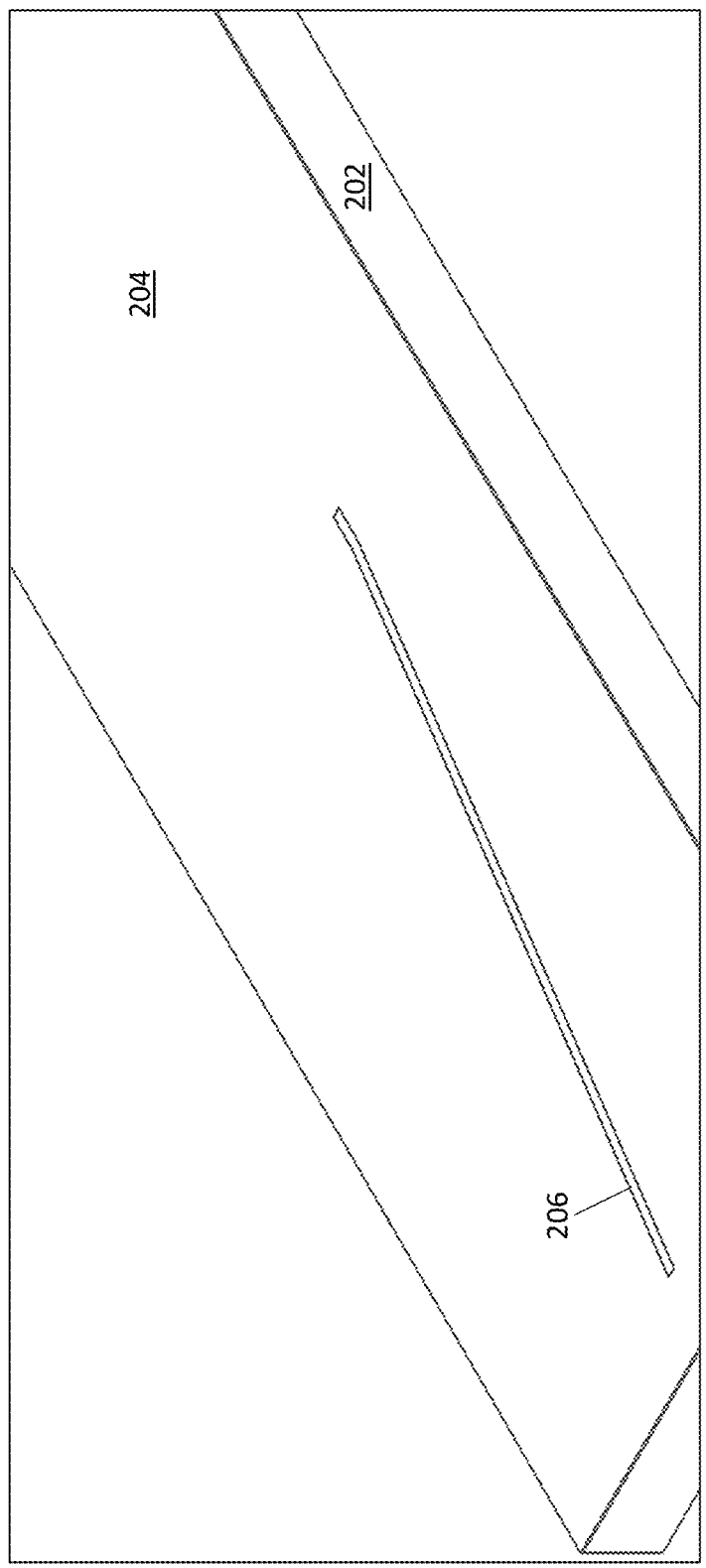
Figure 2C:
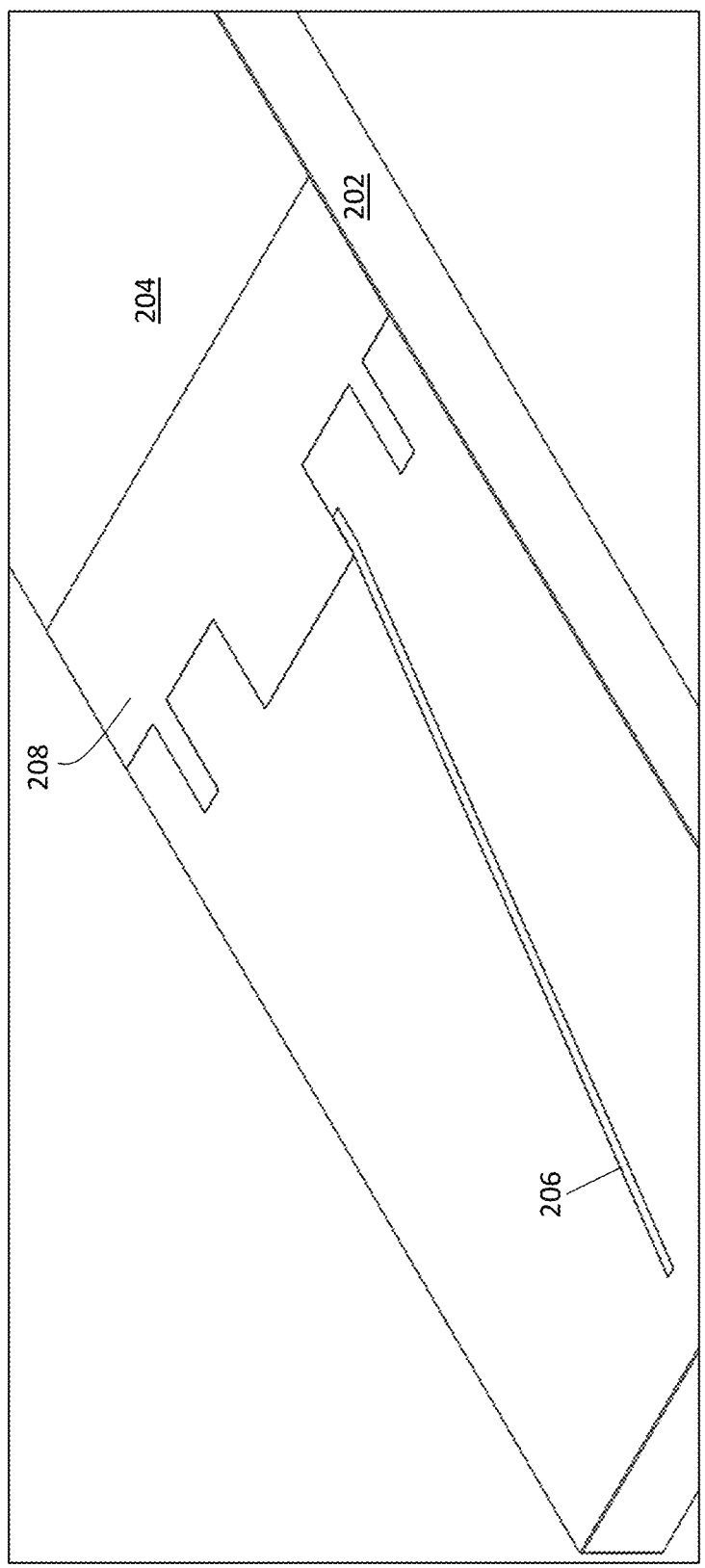
Figure 2D:
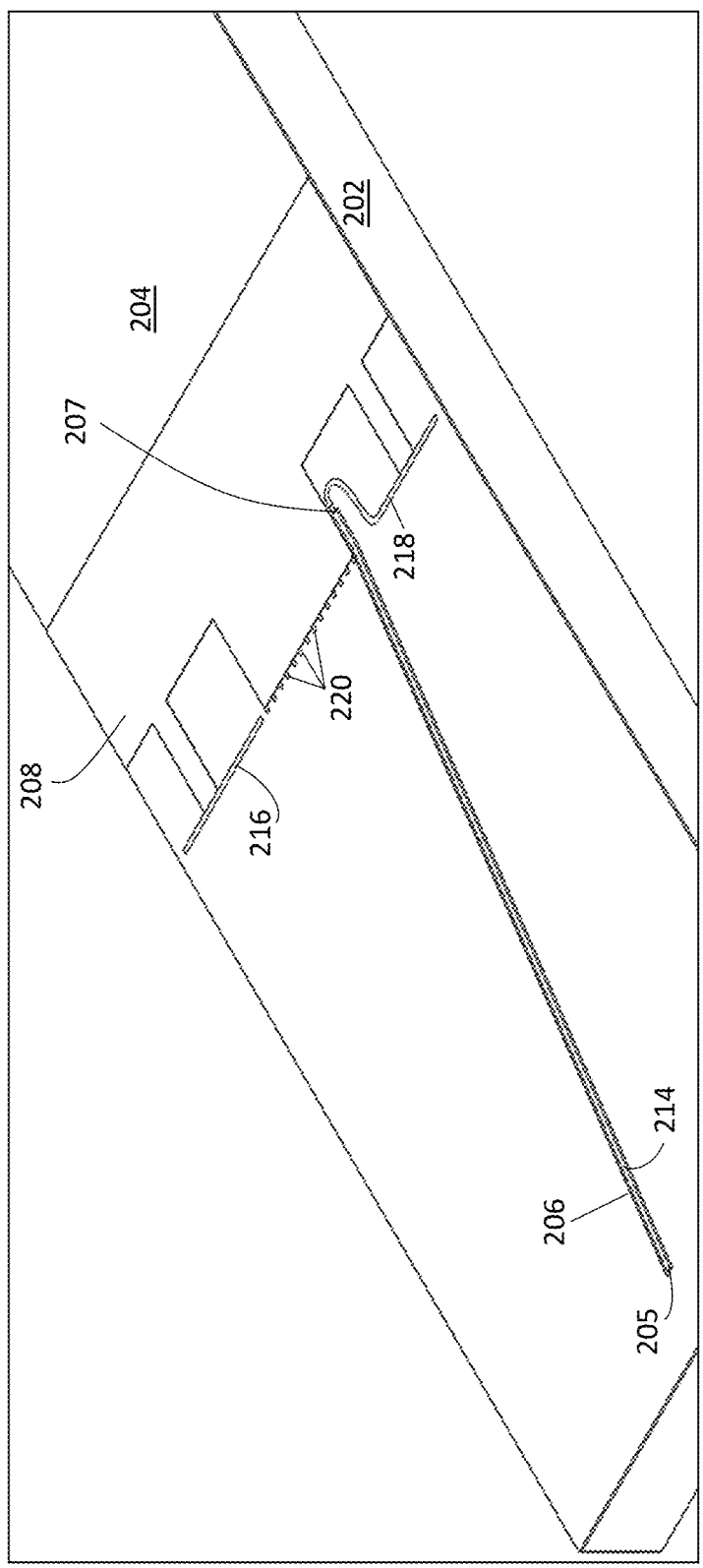
Figure 2E:
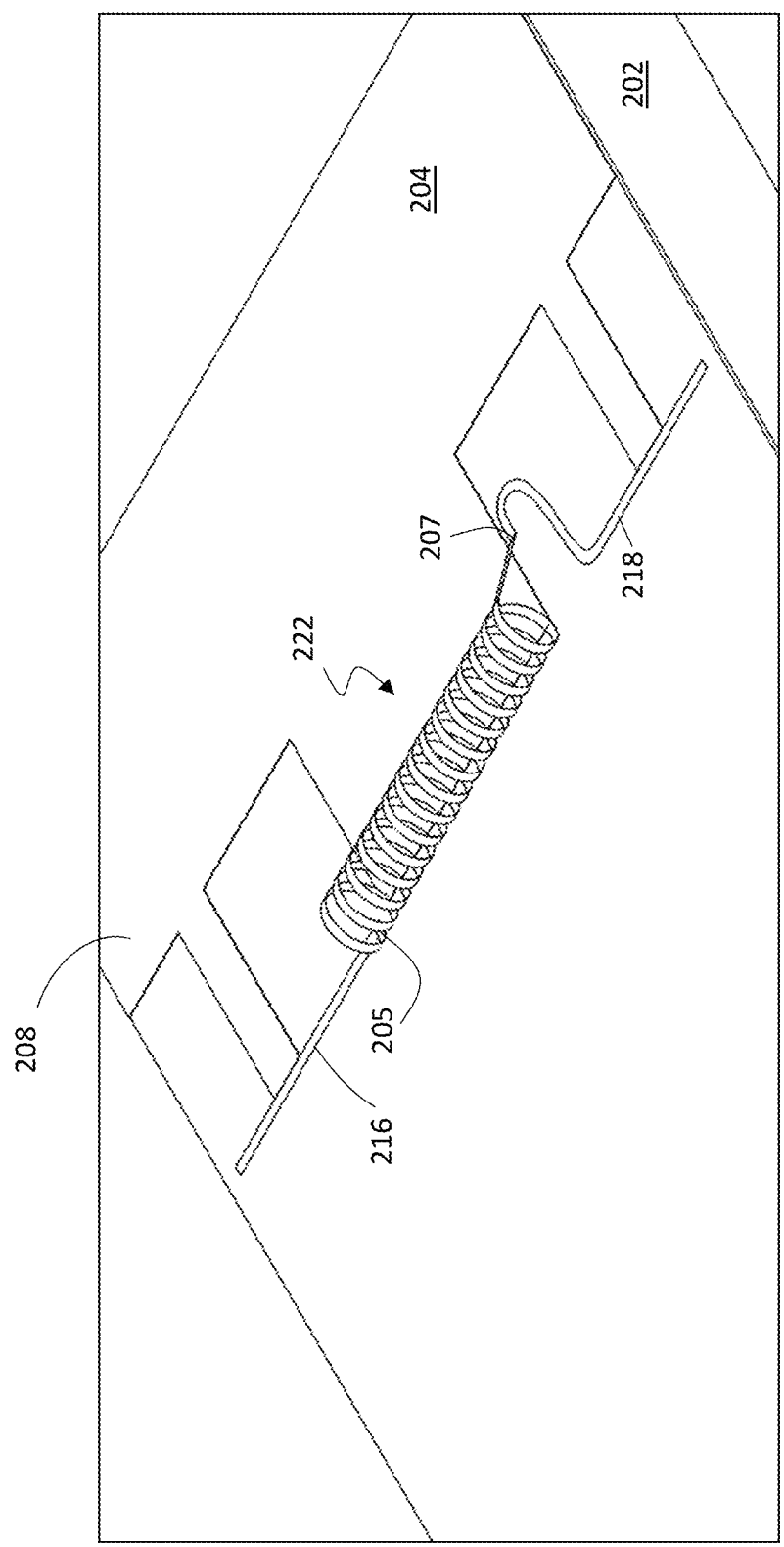
Figure 2F:
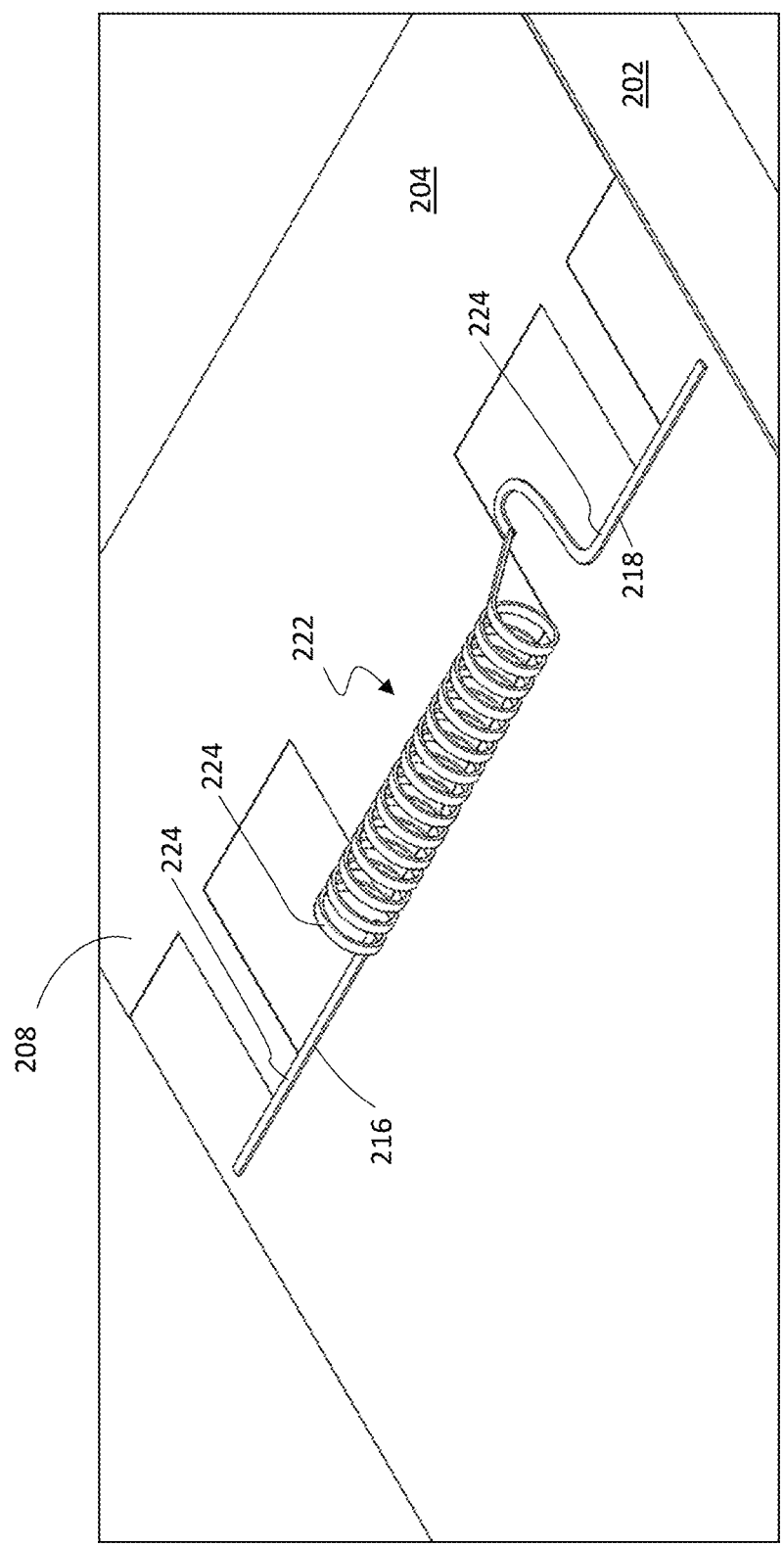
Figure 2G:
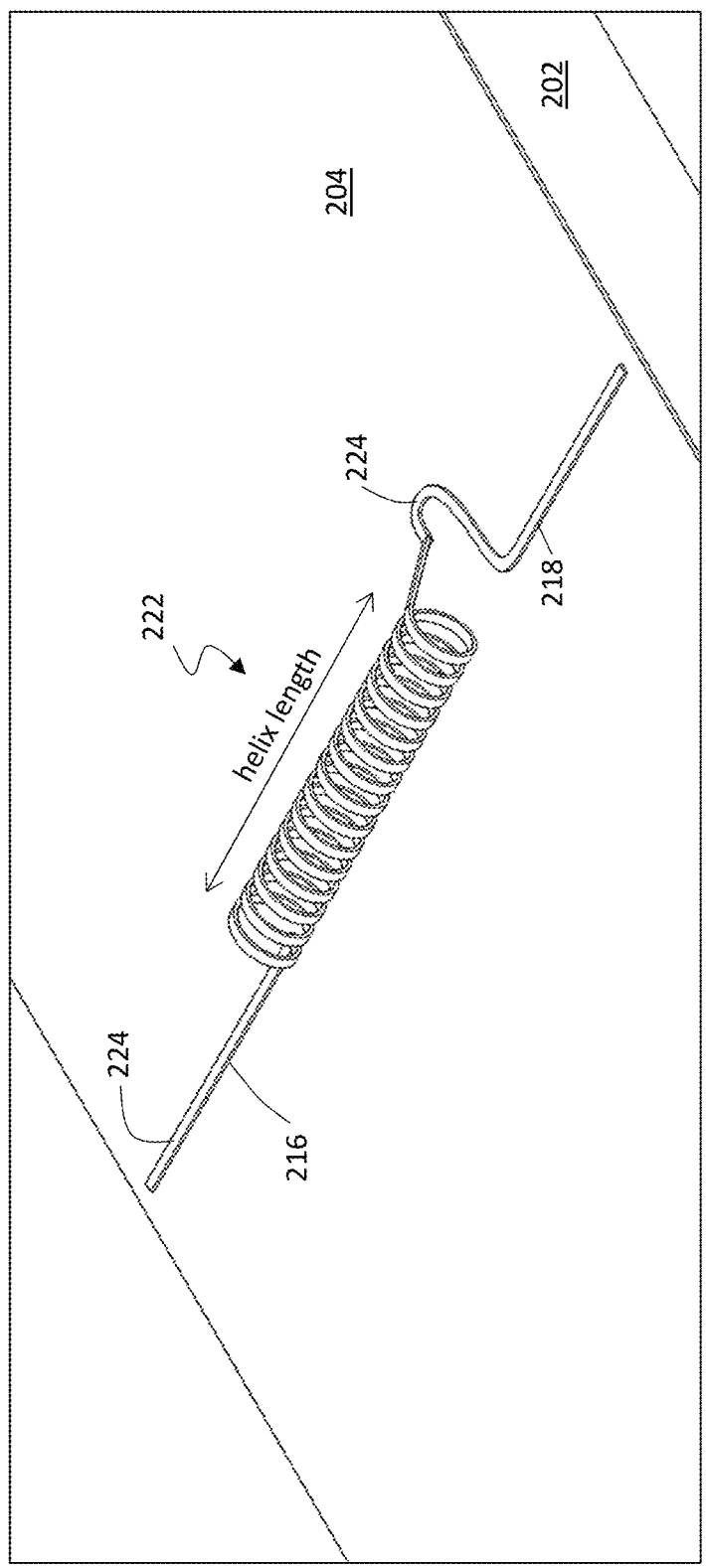

One example of an SWS that can be used in a TWT amplifier is shown in FIG. 2G. The SWS includes a helix 222 formed from a continuous helical strip of electrically conductive material, such as a metal, and a dielectric, thermally conductive support 204. Helix 222 has a leading end that is connected to a first electrical contact 216 and a trailing end that is connected to a second electrical contact 218.

FIGS. 2A through 2G illustrate an example of a method that can be used to make the SWS of FIG. 2G. The process begins with a dielectric support (FIG. 2A). The support is composed of a dielectric, high-resistivity material in order to avoid signal loss in the TWT amplifier. In the illustrative embodiment shown here, the dielectric support includes two layers: a support substrate 202 and a film of dielectric material 204 on a surface of support substrate 202. However, the dielectric support can have more or fewer layers. For example, the dielectric support can be a single, bulk layer of a dielectric material, such as a diamond substrate. The dielectric material should be thermally conductive in order to facilitate the dissipation of heat generated by the SWS. Generally, the dielectric material should be a low-loss material having a thermal conductivity of at least about 10 W/mK at 25° C., preferably at least 20 W/mK at 25° C., and more preferably at least 150 W/mK at 25° C. However, the requirement for thermal conductivity will depend, at least in part, on the required power output of the TWT amplifier and/or whether the TWT amplifier is designed to operate in a continuous mode or a pulsed mode; a lower power output and/or pulsed mode operation will generally require a lower thermal conductivity. In addition, the thickness of the dielectric support can be increased to increase thermal conductivity. Diamond, aluminum nitride (AlN), aluminum oxide ($Al_2O_3$), and silicon nitride ($Si_3N_4$) are examples of low-loss materials that can be used for the support. Because diamond has a very high thermal conductivity (e.g., approximately 2000 W/mK at 25° C. for bulk diamond), it is a preferred choice for high-power and/or continuous mode applications.

In embodiments in which the dielectric support includes a film of dielectric material on a support substrate, the support substrate may be a substrate upon which the dielectric film can be deposited by chemical or physical vapor deposition. For example, a silicon wafer can be used as a substrate for the chemical vapor deposition (CVD) of a diamond film. Alternatively, the film of dielectric material can be formed on another substrate, released, and transferred onto the support substrate. The thickness of the film of dielectric material is not critical, provided that it allows for adequate heat dissipation. By way of illustration, suitable film thicknesses include those in the range from sub-micron (e.g., 500 nm to 1 µm) up to 20 µm. By way of illustration, in some embodiments of the SWSs, the dielectric film has a thickness in the range from 3 µm to 10 µm. Optionally, the surface of the dielectric material can be mechanically polished or coated with a smoothing layer, such as silicon nitride or spin-on-glass, in order to facilitate the subsequent deposition of overlying conductive layers with low surface roughness.

A strip of sacrificial material 206 is formed on the surface of dielectric material 204 (FIG. 2B). The "sacrificial material" is so called because it will ultimately be selectively removed from the structure, as described below. The sacrificial material can be patterned into a strip by, for example, applying a blanket coating of the sacrificial material on dielectric support 204 and then removing (e.g., etching away) some of the sacrificial material to define the strip.

To prepare for a subsequent electroplating step, an electroplating electrode material 208 is deposited over one or more areas of dielectric support 204 (FIG. 2C). Such areas include, for example, areas where electrical contacts will be formed at the ends of the helix and/or areas where contact pads will be formed along the length of the helix. Electroplating electrode material 208 can be blanket deposited over the surface of dielectric material 204 and sacrificial strip 206 and then selectively etched away to expose sacrificial strip 206 and the areas where electroplating is to be carried out. Alternatively, electroplating electrode material 208 can be selectively deposited on only the desired regions of the surface of dielectric support 204 at the outset. The electroplating electrode material provides a low-resistance path from a current source to the components of the SWS that are to be electroplated. Electroplating electrode material 208 is an electrically conductive material, such as aluminum or titanium, that can be selectively removed (e.g., etched or dissolved) from dielectric support 204 after electroplating has been completed. In addition, the electroplating electrode material is desirably one that forms a surface native oxide that is resistant to electroplating when it is exposed to an electroplating solution. For example, aluminum and titanium form native oxides that hinder electroplating. However, if the selected electroplating electrode material does not form a suitable native oxide, it can be coated with an electrically insulating layer that is resistant to electroplating. For example, if copper is used as the electroplating electrode material, it could be coated with aluminum oxide or silicon oxide to render it resistant to electroplating. Virtually any metal can be used, provided that its surfaces are electrically insulated from the plating solution and that both the metal and its electrical insulation can be selectively removed from the structure after the electroplating process is complete.

An electrically conductive strip 214 is then formed on sacrificial strip 206 (FIG. 2D). It should be noted that, although sacrificial strip 206 has substantially the same shape and dimensions as electrically conductive strip 214, the sacrificial strip need not have substantially the same shape and dimensions as electrically conductive strip 214. In fact, the sacrificial material need not even be in the form of a strip. Electrically conductive strip 214 is formed in a stressed state on the sacrificial material, such that upon release from the underlying sacrificial layer 206 it relaxes and forms a helix. Electrically conductive strip 214 has a leading end 205 and a trailing end 207. Trailing end 207 is firmly attached to dielectric substrate 204 so that the trailing end of the helix remains tethered to dielectric substrate 204 after sacrificial layer 206 is removed. In the embodiment shown in FIGS. 2A-2G, electrically conductive strip 214 is a linear strip and leading end 205 is not attached to dielectric substrate 204 so that leading end 205 is released from dielectric support 204 when sacrificial layer 206 is removed. However, in other examples of the SWSs, both the leading and trailing ends of the electrically conductive strip can be attached to the dielectric support and remain so even after the sacrificial material is selectively removed, as discussed below.

The stress in electrically conductive strip 214 can be imparted to the strip in a variety of ways. For example, sacrificial layer 206 can be composed of a material that imparts a tensile stress to the electrically conductive strip 214 as the strip is grown thereon. Alternatively, a thermal-expansion mismatch between sacrificial layer 206 and the material of the electrically conductive strip 214 could provide the requisite stress. In some embodiments of the devices the stress is engineered into the electrically conductive strip by tailoring the deposition parameters, such as deposition rate and/or temperature, and/or the film thickness, during its growth. Stress can also be imparted by the thermo-mechanical stress that arises during post-deposition cooling of the deposited material. For example, strips of metals, such as gold or chromium, can be formed under intrinsic tensile stress by epitaxial growth, sputtering, or evaporation of the metal onto a sacrificial material. Alternatively, multilayered electrically conductive strips can be used in which the strips include stacks of two or more layers of different metals, wherein the layered strip is deposited in a stressed state caused by a lattice and/or thermal-expansion mismatch between the different metals. By way of illustration, electrically conductive strip 214 may include a stressed bilayer comprising a lower layer of chromium and an adjacent upper layer of gold, or vice versa. The single or multi-layered electrically conductive strips can be comprised of, for example, single-crystalline materials or polycrystalline materials.

The selection of the sacrificial material of sacrificial layer 206 and the material of electrically conductive strip 214 will be interdependent, as it must be possible to selectively remove (e.g., etch) the sacrificial material from the structure. Examples of suitable sacrificial materials include silicon oxide and germanium oxide. Other examples include silicon, germanium, and polymers. Examples of electrically conductive materials that can be used to form stressed electrically conductive strips on these, or other, sacrificial materials include metal layers, such as gold layers and gold/chromium bilayers. Other metals that can be used as single layers or in combination with other layers in multilayered strips include copper, nickel, and silver.

Electrically conductive strip 214 is characterized by a strip length (i.e., the distance between leading end 205 and trailing end 207, a strip width, and a strip thickness. Because the electrically conductive strip is formed from a thin film, the strip thickness will typically be smaller than the strip width, and both the strip thickness and width will be substantially smaller than the strip length. Strip length is chosen such that strip 214 rolls into a helix having the desired length for the SWS. Electrically conductive strip 214 should be thin enough to roll into a helix with the desired inner diameter, where a thinner strip will generally provide a helix with a smaller diameter. The strip length, width, and thickness needed to provide a helix with a desired diameter, and pitch will further depend on the magnitude of the stress gradient across the thickness in strip 214, and the mechanical properties of the conductive materials. By way of illustration only, in some embodiments of the SWSs, electrically conductive strip 214 has a thickness in the range from about 20 nm to about 250 nm and a width of about 5 µm to about 30 µm. The width of the strip may be, but need not be, uniform along the length of the strip. The thickness and the width of the strip can be increased by electroplating after the self-assembly of the helix, as discussed below.

Electrical contacts 216, 218 are formed on dielectric support 214 to provide electrical connections to leading and trailing ends 205 and 207, respectively, of helix 222, once it has self-assembled. These contacts can act as the signal input coupler 116 and the signal output coupler 118 of a TWT amplifier, or they can provide a connection to the signal input and output couplers. Optionally, a series of contact pads 220 can also be formed on the dielectric support 204 between electrical contacts 216 and 218. These contact pads are positioned and spaced so that they form electrical and thermal connections with the turns in the helix of the SWS. In some examples of the TWT amplifiers, each turn of the helix has a corresponding contact pad. However, fewer contact pads can be used. Electrical contacts 216, 218 and contact pads 220 are typically formed from metals, and they may be composed of the same material as electrically conductive strip 214 or a different material. The electrical contacts and contact pads can be formed on the dielectric support when the electrically conductive strip is formed, or during an earlier or later stage of the process.

In order to convert continuous linear strip 214 into a continuous helical strip (i.e., into a helix), sacrificial strip 206 is selectively etched to release electrically conductive strip 214, whereby stress release causes it to bend and twist into an electrically conductive helix 222, the trailing end 207 of which remains attached to dielectric support 204 (FIG. 2E). If the strip is a multi-layered strip, the lowermost layer in the strip will form the outer surface of the helix and the uppermost layer in the strip will form the inner surface of the helix. Leading end 205 of helix 222 can then be attached to electrical contact 216. A helix having the desired length, pitch, and inner diameter can be formed by the selection of an electrically conductive strip having appropriate dimensions and degree of strain. By way of illustration, helices having lengths in the range from 0.2 cm to 2 cm can be formed using the methods described herein. The ability to form long helices is advantageous, as a longer helix length provides a higher gain. However, shorter or longer helices can also be formed, including but not limited to, helices with lengths in the range from 100 µm to 10 cm. For the purposes of this disclosure, the length of a helix is the distance between the front edge of the first turn of the helix to the back edge of the last turn of the helix, as shown in FIG. 2G.

Helix 222 is then electroplated to increase the thickness of the electrically conductive strip from which it is constructed (FIG. 2F). If the helix is constructed from a single electroplatable metal strip, such as gold, the electroplated metal will form a plating layer around the electrically conductive strip, which serves as a seed layer for the plating layer 224. If the helix is made from a multilayered strip, the plating metal will be plated onto the exposed surfaces of the electroplatable metal layers in the strip, which serve as seed layers for the plating layer 224. However, it is not necessary for all of the layers in the multilayered strip to be electroplatable. Optionally, electrical contacts 216, 218 and/or contact pads 220 also can be electroplated.

Helix 222, electrical contacts 216, 218, and contact pads 220 can be electroplated with a metal that is the same as, or different from, the metal used to form electrically conductive strip 214. Electroplating is carried out by immersing helix 222 and, optionally also electrical contacts 216, 218 and contact pads 220, in an electroplating solution and creating a voltage difference between electroplating electrode material 208 and a counter electrode (not shown) to induce metal ions in the electroplating solution to deposit onto the surface of helix 222, electrical contacts 216, 218, and contact pads 220.

Increasing the thickness of the helix via electroplating may provide better heat transfer and lower signal loss for the TWT amplifier and also allows for the tailoring of the signal propagating properties (e.g., operating frequencies) of the SWS, whereby smaller inner-diameter wave tubes amplify higher-frequency signals. By way of illustration only, the plating material can be deposited to thicknesses of up to 10 µm or even greater, including plating material thicknesses in the range from 30 nm to 10 µm. Helices having inner diameters of 50 µm or smaller can be made using the methods described herein. This includes helices having inner diameters of 30 µm or smaller. For example, helices having inner diameters in the range from 0.5 µm to 30 µm can be fabricated. However, helices with inner diameters outside of this range can also be fabricated. Using the self-assembly and electroplating processes described herein, SWSs capable of amplifying terahertz signals with frequencies in the range from 0.3 THz to 3 THz can be fabricated.

Once the electroplating is completed, electroplating electrode material 208 can be removed (FIG. 2G). If the electroplating electrode material is made from aluminum, this can be accomplished by etching in a piranha solution or commercially available aluminum etchants.

Figure 3A:
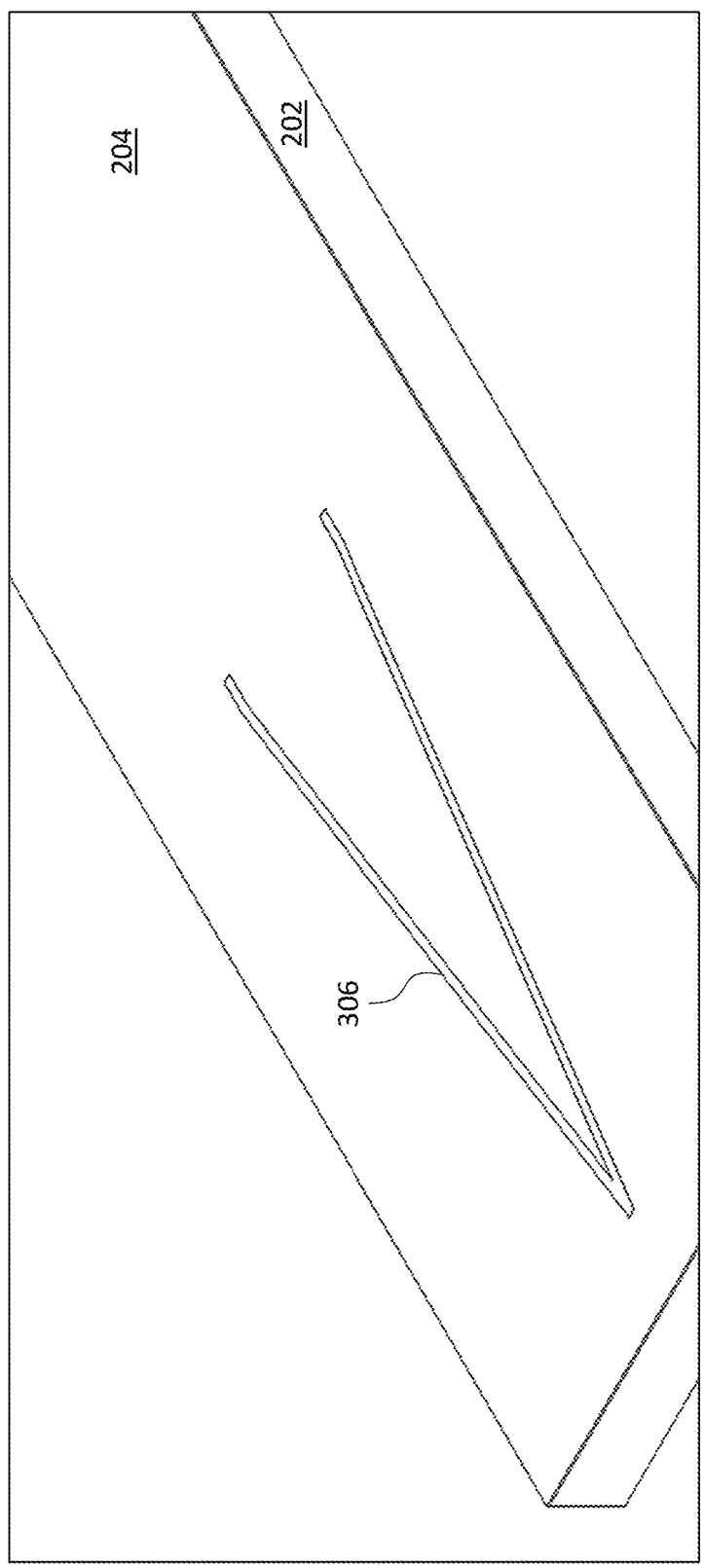
FIGS. 3A-3F illustrate a method of making a second example of a slow-wave structure.
Figure 3B:
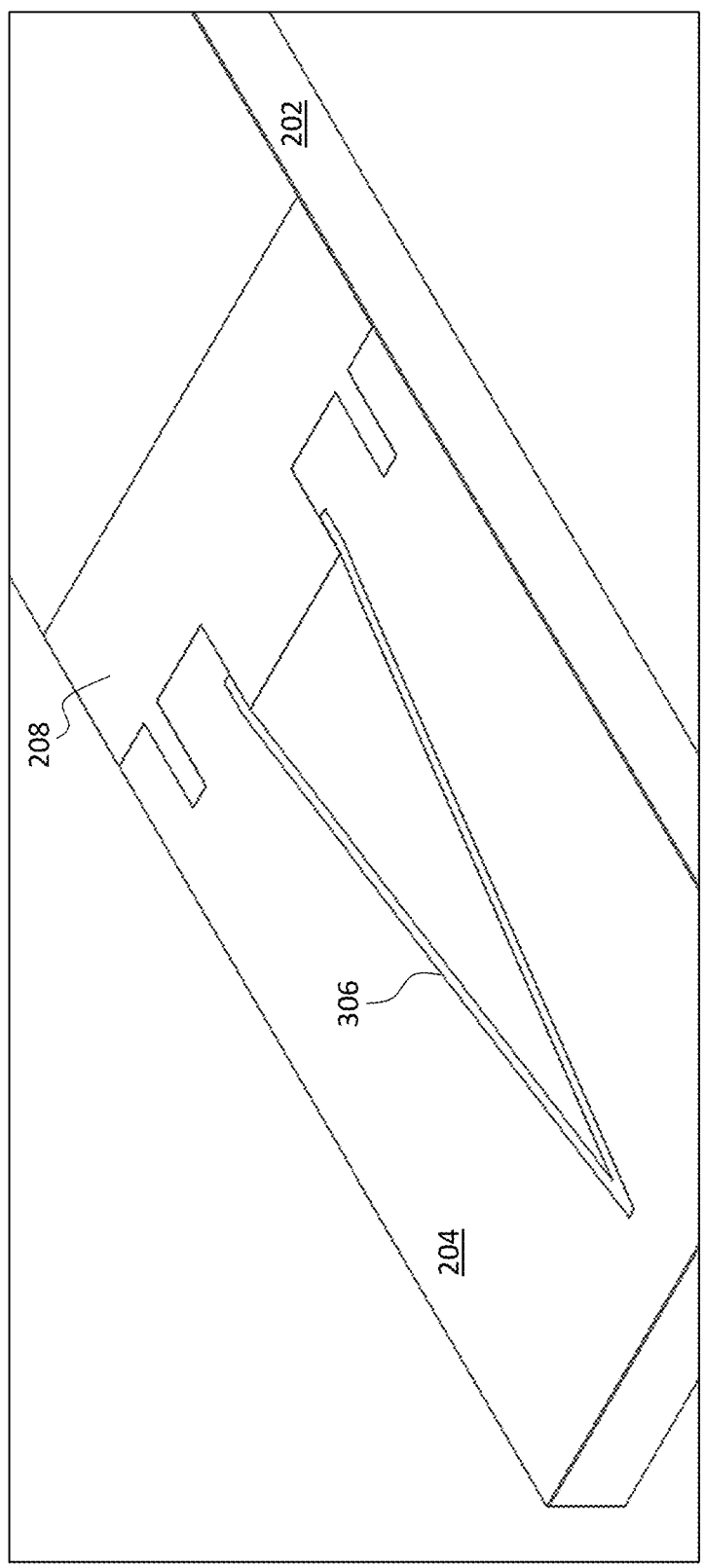
Figure 3C:
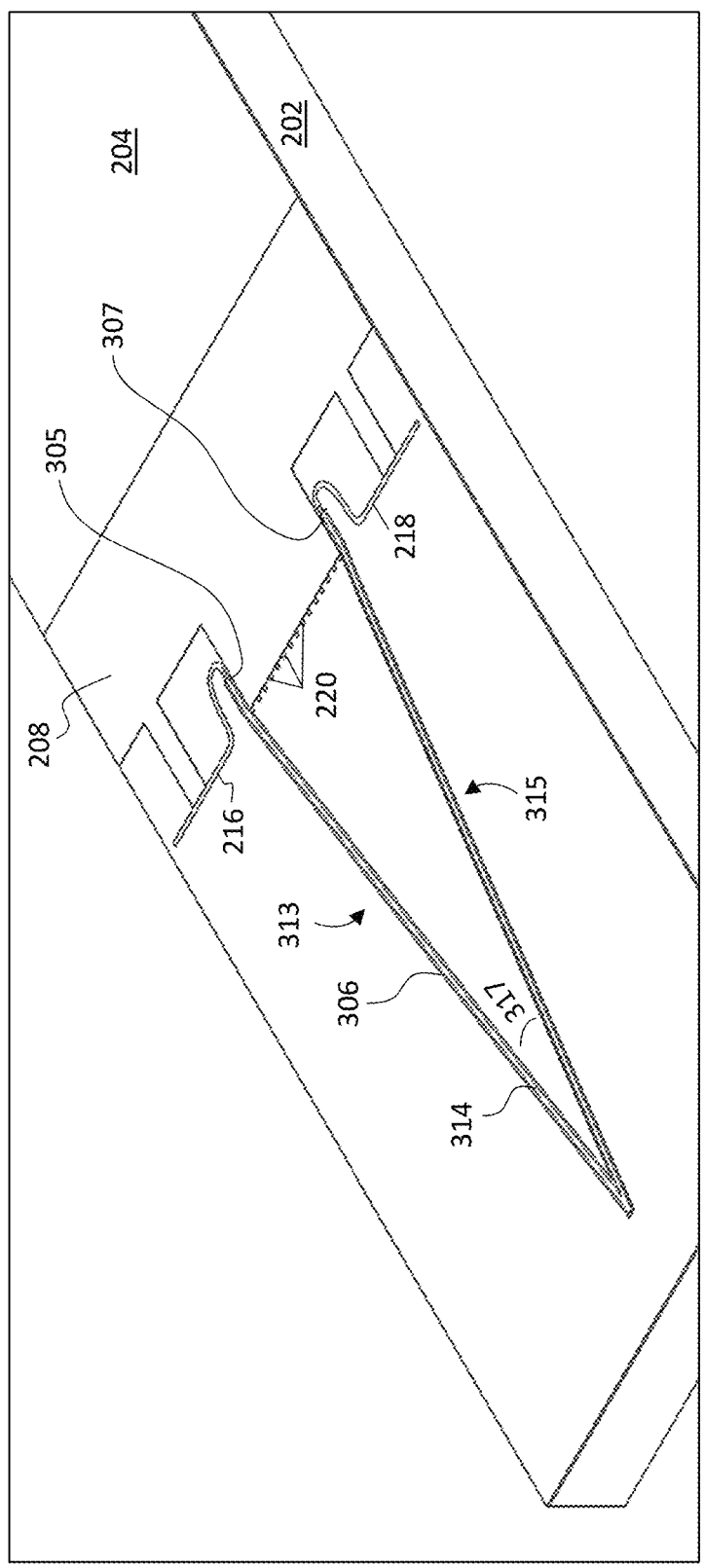
Figure 3D:
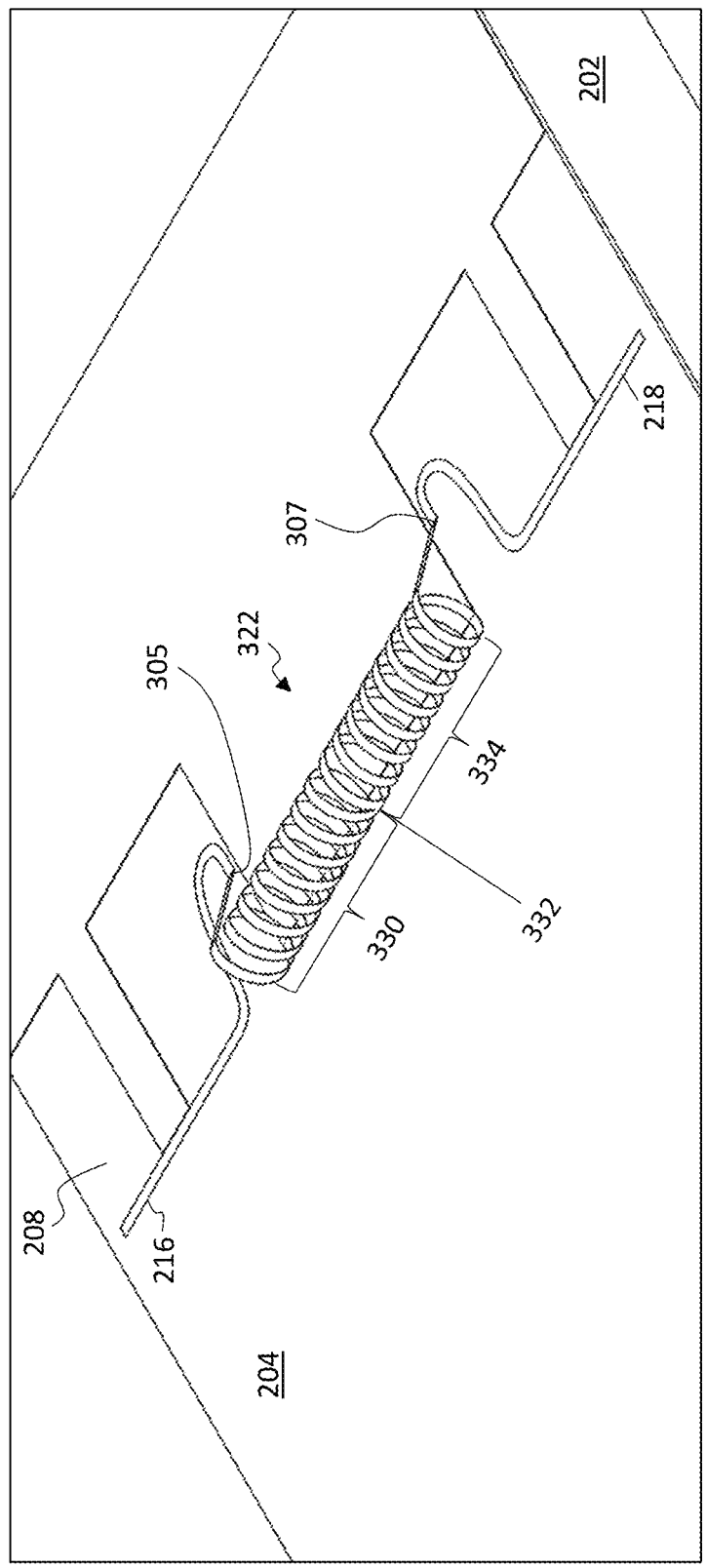
Figure 3E:
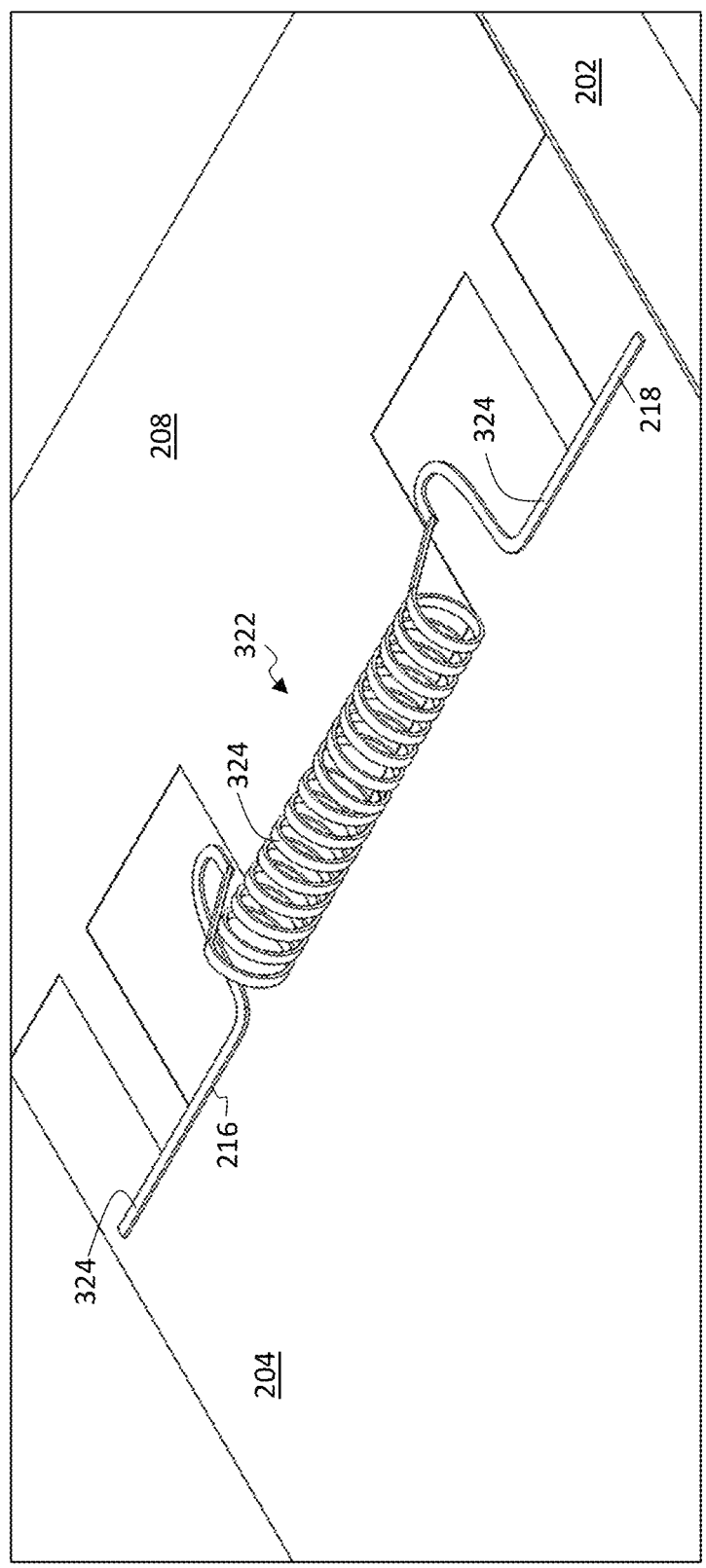
Figure 3F:
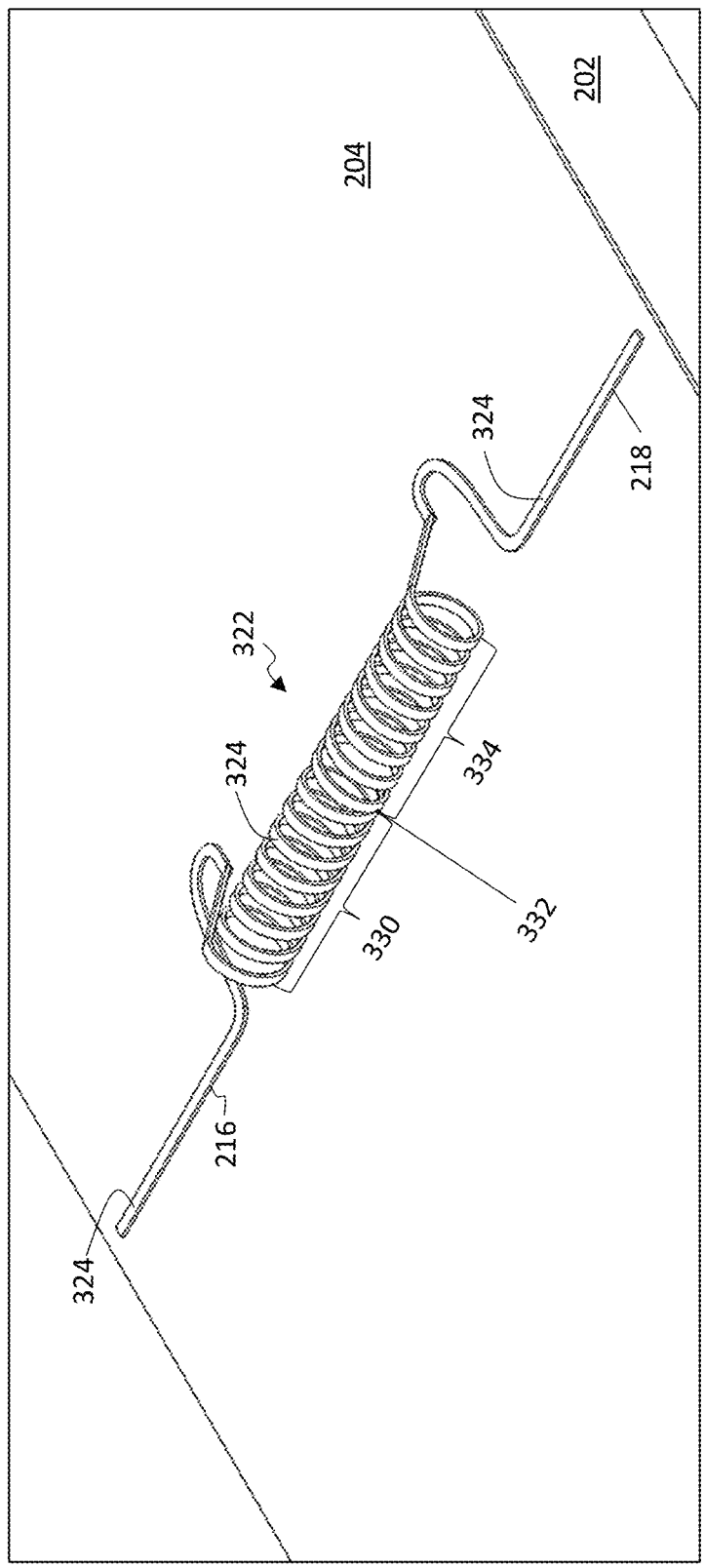

A second example of an SWS is shown in FIG. 3F. The SWS of FIG. 3F shares some common processing steps and components with the SWS of FIG. 2G, as indicated by like reference numbers. However, in the example of FIG. 3F, the helix 322 is made using a bent sacrificial strip 306 (FIGS. 3A and 3B) upon which a bent electrically conductive strip 314 is deposited (FIG. 3C). The bent electrically conductive strip has a first linear segment 313 and a second linear segment 315 that are connected at an angle 317 of less than 180°. As shown in the illustrative embodiment of FIG. 3C, the connecting angle may be 90° or smaller. Both the leading end 305 and the trailing end 307 of electrically conductive strip 314 are attached to dielectric support 204 and in contact with electroplating electrode material 208 (FIGS. 3B and 3C). When sacrificial layer 306 is removed, stress release in electrically conductive strip 314 causes it to roll into a helix 322 (FIG. 3D). However, because leading end 305 and trailing end 307 are tethered to dielectric support 204, the resulting helix is characterized by a right-handed helical segment 330 and a left-handed helical segment 334 connected by a connecting segment 332 that is formed at the bend in electrically conducting strip 314.

Helix 322 can be electroplated to form a plating layer 324 on its surface (FIG. 3E), as described above, and electroplating electrode material 208 can be removed from dielectric support 204 (FIG. 3F).

The materials, dimensions, and stresses of electrically conductive strip 314 and the plating layer 324 may be the same as those described above with respect to linear electrically conductive strip 214. However, the size of the angle in the bent electrically conductive strip offers one more parameter that can be tailored to provide a SWS having the desired dimensions and operating properties, as the pitch in the helix (i.e., the turn-to-turn distance) will be a function of that angle.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A traveling-wave tube amplifier comprising:
    a dielectric support;
    a slow-wave structure on the dielectric support, the slow-wave structure comprising an electrically conductive helix comprising a continuous helical strip of electrically conductive material and having an inner diameter of no greater than 30 µm;
    an electron gun positioned to direct one or more beams of electrons axially through the electrically conductive helix or around the periphery of the electrically conductive helix; and
    an electron collector positioned opposite the electron beam source.

2. The amplifier of claim 1, wherein the helical strip comprises a seed layer and a plating layer on a surface of the seed layer.

3. The amplifier of claim 1, wherein the helical strip of electrically conductive material consists of a single layer of a metal.

4. The amplifier of claim 3, wherein the metal is gold.

5. The amplifier of claim 3, wherein the metal is copper, nickel, or silver.

6. The amplifier of claim 1, wherein the helical strip comprises a central seed layer of a metal and a plating layer of the metal disposed around the central seed layer.

7. The amplifier of claim 1, wherein the helical strip of electrically conducting material is a bilayer strip comprising a first metal layer and a second metal layer, wherein the second metal is disposed on the top of the first metal along the length of the helical strip.

8. The amplifier of claim 7, wherein one of the first and second metal layers is a chromium layer and the other of the first and second metal layers is a gold layer.

9. The amplifier of claim 7, wherein the helical strip further comprises a plating layer of the first metal on a surface of the first metal layer.

10. The amplifier of claim 1, wherein the helical strip comprises a right-handed helical segment, a left-handed helical segment, and a connection segment connecting the right-handed helical segment to the left-handed helical segment.

11. The amplifier of claim 1, further comprising one or more contact pads on the dielectric support, wherein one or more turns along the length of the electrically conductive helix are connected to the one or more contact pads.

12. The amplifier of claim 1, wherein the dielectric support comprises diamond, aluminum nitride, aluminum oxide, or silicon nitride.

13. The amplifier of claim 1, wherein the electrically conductive helix has an inner diameter in the range from 1 µm to 30 µm.

14. The amplifier of claim 1, wherein the electrically conductive helix has a length in the range from 100 µm to 2 cm.

15. A method of making a slow-wave structure, the method comprising:
    forming a layer of sacrificial material on a portion of a surface of a dielectric support;
    forming a continuous stressed electrically conductive strip on the layer of sacrificial material, the electrically conductive strip having a leading end and a trailing end, wherein the trailing end of the electrically conductive strip is attached to the dielectric support, and further wherein the electrically conductive strip comprises an electrically conductive material in contact with the layer of sacrificial material;
    selectively removing the layer of sacrificial material, wherein the continuous stressed electrically conductive strip relaxes into the form of a helix;
    connecting the leading end of the electrically conductive strip to a first electrical contact;

connecting the trailing end of the electrically conductive strip to a second electrical contact; and electroplating the surface of the helix with an electrically conductive material.

16. The method of claim 15, further comprising connecting one or more turns in the helix with one or more contact pads positioned on the dielectric support between the first electrical contact and the second electrical contact.

17. The method of claim 16, further comprising electroplating the first electrical contact, the second electrical contact, and the contact pads.

18. The method of claim 15, wherein the continuous stressed electrically conductive strip is a linear strip.

19. The method of claim 15, wherein the continuous stressed electrically conductive strip comprises a first linear segment and a second linear segment, wherein the first and second angles are joined at an angle of less than 180°.

20. The method of claim 15, wherein the sacrificial material is an oxide and the continuous stressed electrically conductive strip comprises only a single layer of metal or comprises two or more vertically stacked layers of different metals.

* * * * *